United States Patent
Dudeck et al.

(10) Patent No.: US 7,848,172 B2
(45) Date of Patent: Dec. 7, 2010

(54) MEMORY CIRCUIT HAVING REDUCED POWER CONSUMPTION

(75) Inventors: Dennis E. Dudeck, Hazleton, PA (US); Donald Albert Evans, Lancaster, OH (US); Hai Quang Pham, Hatfield, PA (US); Wayne E. Werner, Coopersburg, PA (US); Ronald James Wozniak, Whitehall, PA (US)

(73) Assignee: Agere Systems Inc., Allentown, PA (US)

( * ) Notice: Subject to any disclaimer, the term of this patent is extended or adjusted under 35 U.S.C. 154(b) by 86 days.

(21) Appl. No.: 12/276,576

(22) Filed: Nov. 24, 2008

(65) Prior Publication Data

US 2010/0128549 A1     May 27, 2010

(51) Int. Cl.
*G11C 5/14* (2006.01)
(52) U.S. Cl. ........................... 365/227; 365/226
(58) Field of Classification Search ................ 365/226, 365/227
See application file for complete search history.

(56) References Cited

U.S. PATENT DOCUMENTS

| | | | |
|---|---|---|---|
| 5,615,162 A * | 3/1997 | Houston | 365/226 |
| 6,515,935 B1 * | 2/2003 | Fetzer | 365/227 |
| 6,657,911 B2 * | 12/2003 | Yamaoka et al. | 365/226 |
| 6,917,555 B2 * | 7/2005 | Bedwell et al. | 365/226 |
| 7,111,190 B2 * | 9/2006 | Venkatraman et al. | 714/6 |
| 7,327,630 B2 * | 2/2008 | Park | 365/226 |
| 7,379,350 B2 * | 5/2008 | Fukuda | 365/189.05 |
| 7,386,656 B2 * | 6/2008 | Rajan et al. | 711/103 |
| 7,626,883 B2 * | 12/2009 | Shimano et al. | 365/226 |
| 2003/0061448 A1 * | 3/2003 | Rawson, III | 711/133 |
| 2005/0146910 A1 * | 7/2005 | Venkatraman et al. | 365/51 |
| 2005/0232053 A1 * | 10/2005 | Azuma et al. | 365/226 |
| 2006/0133180 A1 * | 6/2006 | Watanabe et al. | 365/226 |
| 2009/0103386 A1 * | 4/2009 | Rao | 365/227 |

* cited by examiner

*Primary Examiner*—Son L Mai
(74) *Attorney, Agent, or Firm*—Ryan, Mason & Lewis, LLP

(57) ABSTRACT

A memory circuit having reduced power consumption includes a plurality of memory sub-arrays and a shared circuit coupled to each of the memory sub-arrays. Each memory sub-array includes at least one row circuit, at least one column circuit, and a plurality of memory cells operatively coupled to the row and column circuits. The row and column circuits are operative to provide selective access to one or more of the memory cells. The shared circuit includes circuitry, external to the memory sub-arrays, which is operative to control one or more functions of the memory sub-arrays as a function of at least one control signal supplied to the memory circuit. The memory circuit is operative, with at least one of the memory sub-arrays operative, with one or more of the memory sub-arrays powered and concurrently with one or more of the memory sub-arrays unpowered.

20 Claims, 6 Drawing Sheets

| 3rd POWER CONTROL OUTPUT 463 | 2nd POWER CONTROL OUTPUT 462 | 1st POWER CONTROL OUTPUT 461 | 3rd TRANSISTOR 342 | 2nd TRANSISTOR 341 | 1st TRANSISTOR 340 | 3rd SUB-ARRAY 312 | 2nd SUB-ARRAY 311 | 1st SUB-ARRAY 310 |
|---|---|---|---|---|---|---|---|---|
| LOGIC-0 | LOGIC-0 | LOGIC-0 | OFF-STATE | OFF-STATE | OFF-STATE | UNPOWERED | UNPOWERED | UNPOWERED |
| LOGIC-0 | LOGIC-0 | LOGIC-1 | OFF-STATE | OFF-STATE | ON-STATE | UNPOWERED | UNPOWERED | POWERED |
| LOGIC-0 | LOGIC-1 | LOGIC-0 | OFF-STATE | ON-STATE | OFF-STATE | UNPOWERED | POWERED | UNPOWERED |
| LOGIC-0 | LOGIC-1 | LOGIC-1 | OFF-STATE | ON-STATE | ON-STATE | UNPOWERED | POWERED | POWERED |
| LOGIC-1 | LOGIC-0 | LOGIC-0 | ON-STATE | OFF-STATE | OFF-STATE | POWERED | UNPOWERED | UNPOWERED |
| LOGIC-1 | LOGIC-0 | LOGIC-1 | ON-STATE | OFF-STATE | ON-STATE | POWERED | UNPOWERED | POWERED |
| LOGIC-1 | LOGIC-1 | LOGIC-0 | ON-STATE | ON-STATE | OFF-STATE | POWERED | POWERED | UNPOWERED |
| LOGIC-1 | LOGIC-1 | LOGIC-1 | ON-STATE | ON-STATE | ON-STATE | POWERED | POWERED | POWERED |

600

700

800

MEMORY CIRCUIT HAVING REDUCED POWER CONSUMPTION

FIELD OF THE INVENTION

The present invention relates generally to integrated circuits, and more particularly relates to memory circuits.

BACKGROUND OF THE INVENTION

More memories and larger memories are being used within integrated circuits (ICs), for example as embedded memory, in various applications. Additionally, as feature sizes become smaller, the percentage of area in the IC devoted to memories has been increasing. Consequently, the total power and the percentage of IC power being consumed by memories, relative to other circuit blocks in the IC, are increasing.

The memory within ICs may comprise one memory instance, which may include a small or a very large number of memory cells. Typically, a large memory instance within an IC may comprise up to a few hundred million memory cells, that is, a few hundred megabits of memory. A relatively small memory instance may comprise, for example, less than one million memory cells, that is, less than one megabit of memory. Alternately, an IC may comprise a plurality of memory instances, each memory instance including a small or a very large number of memory cells. The plurality of memory instances need not have the same number of memory cells relative to one another.

Large memories tend to consume significant power in an IC. Therefore, in order to conserve power, it is known to use multiple memories as building blocks for larger memory, and only power up the block that is currently being used. A disadvantage of this approach, however, is that multiple memories will consume more area due, at least in part, to the added peripheral circuitry required for each memory. Additionally, peripheral circuitry typically consumes more leakage current, which is undesirable.

Accordingly, there exists a need for an improved memory architecture which does not suffer from one or more of the above-described problems associated with conventional memory architectures.

SUMMARY OF THE INVENTION

Illustrative embodiments of the present invention meet the above-noted need by providing techniques for advantageously reducing power consumption in a memory circuit without negatively impacting performance or other advantageous features of the memory circuit, such as, for example, size. To accomplish this, embodiments of the invention beneficially provide a memory circuit including a plurality of memory sub-arrays, wherein only a selected subset of the memory sub-arrays are powered at any given time. The selected powered subset of memory sub-arrays may be, for example, memory sub-arrays including memory cells that are accessed during the period of time that the selected memory sub-arrays are powered. Alternatively, the selected powered subset of the memory sub-arrays may be sub-arrays of volatile memory that must retain data during the period of time that the selected sub-arrays are powered.

In accordance with one aspect of the invention, a memory circuit having reduced power consumption includes a plurality of memory sub-arrays and a shared circuit coupled to each of the memory sub-arrays. Each memory sub-array includes at least one row circuit, at least one column circuit, and a plurality of memory cells operatively coupled to the row and column circuits. The row and column circuits are operative to provide selective access to one or more of the memory cells. The shared circuit includes circuitry, external to the memory sub-arrays, which is operative to control one or more functions of the memory sub-arrays as a function of at least one control signal supplied to the memory circuit. The memory circuit is operative, with at least one of the memory sub-arrays operative, with one or more of the memory sub-arrays powered and concurrently with one or more of the memory sub-arrays unpowered.

In accordance with another aspect of the invention, an integrated circuit including one or more memory circuits, embedded or otherwise, having reduced power consumption is provided. At least one memory circuit includes a plurality of memory sub-arrays and a shared circuit coupled to each of the memory sub-arrays. Each memory sub-array includes at least one row circuit, at least one column circuit, and a plurality of memory cells operatively coupled to the row and column circuits. The row and column circuits are operative to provide selective access to one or more of the memory cells. The shared circuit includes circuitry, external to the memory sub-arrays, which is operative to control one or more functions of the memory sub-arrays as a function of at least one control signal supplied to the memory circuit. The memory circuit is operative, with at least one of the memory sub-arrays operative, with one or more of the memory sub-arrays powered and concurrently with one or more of the memory sub-arrays unpowered.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 5 is a table illustrating a correspondence between states of power control outputs, the activation of power-switching transistors and sub-array power states for the illustrative power control circuit shown in FIG. 4, in accordance with an embodiment of the present invention.

DETAILED DESCRIPTION OF THE INVENTION

The present invention will be described herein in the context of illustrative embodiments of a memory circuit and method for powering a memory circuit. It is to be appreciated, however, that the techniques of the present invention are not limited to the specific circuits and method shown and described herein. Rather, embodiments of the invention are directed broadly to improved techniques for accessing data in a memory circuit in a manner which reduces power consumption in the memory circuit. For this reason, numerous modifications can be made to the embodiments shown and the results will still be within the scope of the invention. No limitations with respect to the specific embodiments described herein are intended or should be inferred.

Although implementations of the present invention may be described herein with specific reference to n-channel metal-oxide-semiconductor (NMOS) transistors devices and p-channel metal-oxide-semiconductor (PMOS) transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Embodiments of the invention are directed to memory circuits comprising memories that are arranged into a plurality of memory sub-arrays. In comparison to a fully powered memory circuit, active and leakage power can be advantageously reduced by powering less than a total number of the memory sub-arrays in the circuit, while leaving the remaining sub-arrays unpowered. The selected powered memory sub-arrays are, for example, sub-arrays including memory cells that are accessed (e.g., read, written, programmed and/or refreshed) during the period of time that those selected sub-arrays are powered on. Alternatively, for volatile memory, such as, for example, static random access memory (SRAM), the selected powered memory sub-arrays preferably comprise sub-arrays operative to store data that needs to be retained.

Aspects of the invention reduce the required semiconductor area occupied by memory by combining into one memory instance what would otherwise be separate memory instances, and their associated peripheral circuitry, required to provide blocks of memory that are selectively powered and selectively unpowered. The reduced area requirement lowers manufacturing costs of memory and ICs comprising the memory. As will be described in further detail herein below, the single memory instance beneficially shares peripheral circuitry needed by the memory sub-arrays to operate. In addition to the savings in area, by sharing peripheral circuitry, active and leakage power consumption in the memory is reduced.

Figure 1:
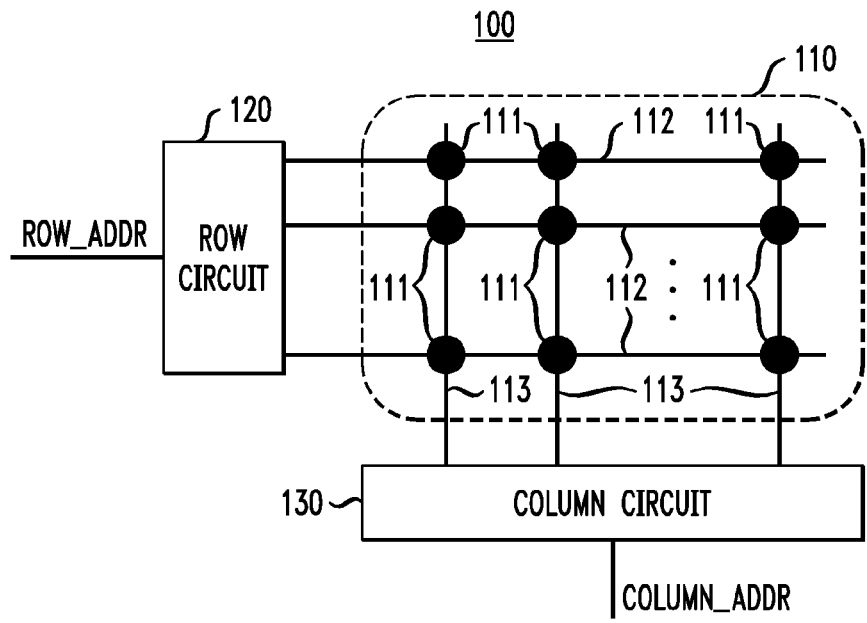
FIG. 1 is a schematic diagram depicting an exemplary memory sub-array, in accordance with an embodiment of the present invention.

FIG. 1 is a schematic diagram depicting an exemplary memory sub-array 100, formed in accordance with an embodiment of the present invention. Memory sub-array 100 comprises a plurality of memory cells 111, at least one row line 112, and at least one column line 113. The memory cells 111 are preferably arranged in a plurality of rows and columns, with each memory cell being located at an intersection of a corresponding unique pair of a row line 112 and a column line 113. Alternative arrangements of the memory cells 111 are similarly contemplated by the invention. Memory cells 111 may comprise, for example, volatile memory cells and/or non-volatile memory cells. Volatile memory cells loose data content when power is removed from the cell. Types of volatile memory cells include, for example, SRAM and dynamic random access memory (DRAM). Non-volatile memory cells, on the other hand, retain data content even when not powered. Types of non-volatile memory cells suitable for use in the present invention include, for example, flash memory cells, phase change memory (PCM) cells, one time programmable (OTP) memory cells, few times programmable (FTP) memory cells, read-only memory (ROM) cells, etc.

The memory sub-array 100 further comprises a row circuit 120 and column circuit 130. Row circuit 120 preferably comprises a row address decoder and one row driver coupled to each row line 112 (not explicitly shown). The row address decoder is coupled to the row drivers and selects a given one of the rows as a function of a row address signal (Row_Addr) supplied to the row circuit 120. Column circuit 130 preferably comprises a column address decoder, column multiplexers, and sense amplifiers (not explicitly shown) coupled to the column lines 113 either directly or through the column multiplexers. Column circuit 130 selects a given one of the column lines 113 coupled thereto as a function of a column address signal (Column_Addr) supplied to the column circuit. Alternative circuitry for selectively accessing the memory cells 111 coupled to the row and column lines 112, 113 is similarly contemplated by the invention.

Figure 2:
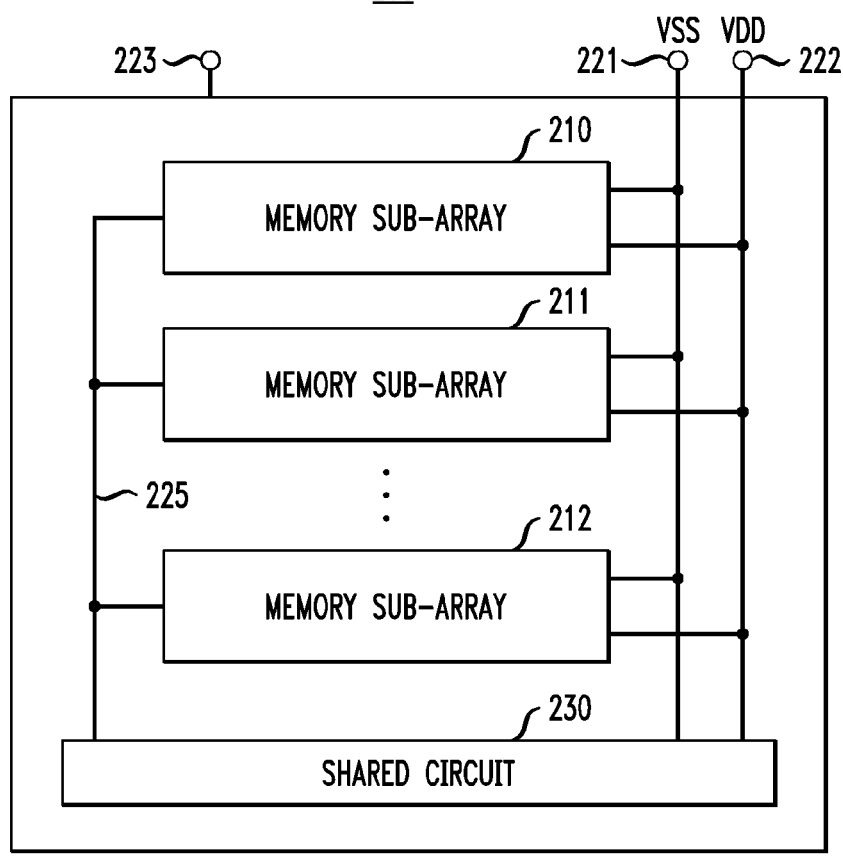
FIG. 2 is a schematic diagram depicting an exemplary memory circuit comprising multiple sub-arrays which are all powered or all unpowered at the same time, in accordance with an embodiment of the present invention.

FIG. 2 is a schematic diagram depicting an exemplary memory circuit 200 comprising multiple sub-arrays, 210, 211 and 212, which are all powered or all unpowered at the same time, in accordance with an embodiment of the present invention. Memory cells in memory circuit 200 are preferably arranged into a plurality of memory sub-arrays 210, 211 and 212. The term "sub-array" as used herein may be defined so as to broadly encompass any grouping of memory cells in the memory circuit, with each sub-array including less than a total number of memory cells in the memory circuit. For example, in illustrative embodiments of the invention, memory sub-arrays 210, 211 and 212 may each include the same number of memory cells. Alternatively, one or more sub-arrays may include a different number of memory cells relative to one or more other sub-arrays in the memory circuit. Although only three memory sub-arrays are shown, the invention is not limited to any specific number of memory sub-arrays.

Memory circuit 200 further comprises a first power connection 221, which may be a VSS or ground connection, a second power connection 222, which may be a VDD connection, and, optionally, one or more other connections 223 provided to the memory circuit. One or more of memory sub-arrays 210, 211 and 212 may comprise, for example, memory sub-array 100 depicted in FIG. 1, although alternative memory sub-array architectures are contemplated by the invention.

The first and second power connections 221 and 222 are preferably coupled to first sub-array 210, second sub-array 211 and third sub-array 212. First power connection 221 may be used, for example, for providing a connection to VSS or ground, or an alternative voltage return of the memory circuit 200. Likewise, second power connection 222 may be used, for example, for providing a connection to VDD, or an alternative voltage supply of the memory circuit 200. Connection(s) 223 may be employed, for example, for supplying one or more other signals to the memory circuit, including a memory enable signal, address inputs, data inputs, data outputs and various memory control signals, as will be appreciated by those skilled in the art.

Memory circuit 200 further comprises at least one shared circuit 230 coupled to each of the memory sub-arrays 210, 211 and 212. At least one internal connection 225 may be employed for coupling the shared circuit 230 to the memory sub-arrays 210, 211 and 212. Shared circuit 230 may comprise circuitry external to the memory sub-arrays and operative to control one or more functions of the sub-arrays. For example, shared circuit 230 may include, but is not limited to, one or more of the following: a voltage regulator, a control circuit, a delay circuit, a timing circuit, a digital circuit, an analog circuit, a redundancy circuit, a built-in-self-test (BIST) circuit, a built-in-self-repair (BISR) circuit, one or more input buffers, and one or more output buffers. Although not explicitly shown, shared circuit 230 is preferably coupled to connection(s) 223 for providing external access to and/or from the shared circuit.

Figure 3:
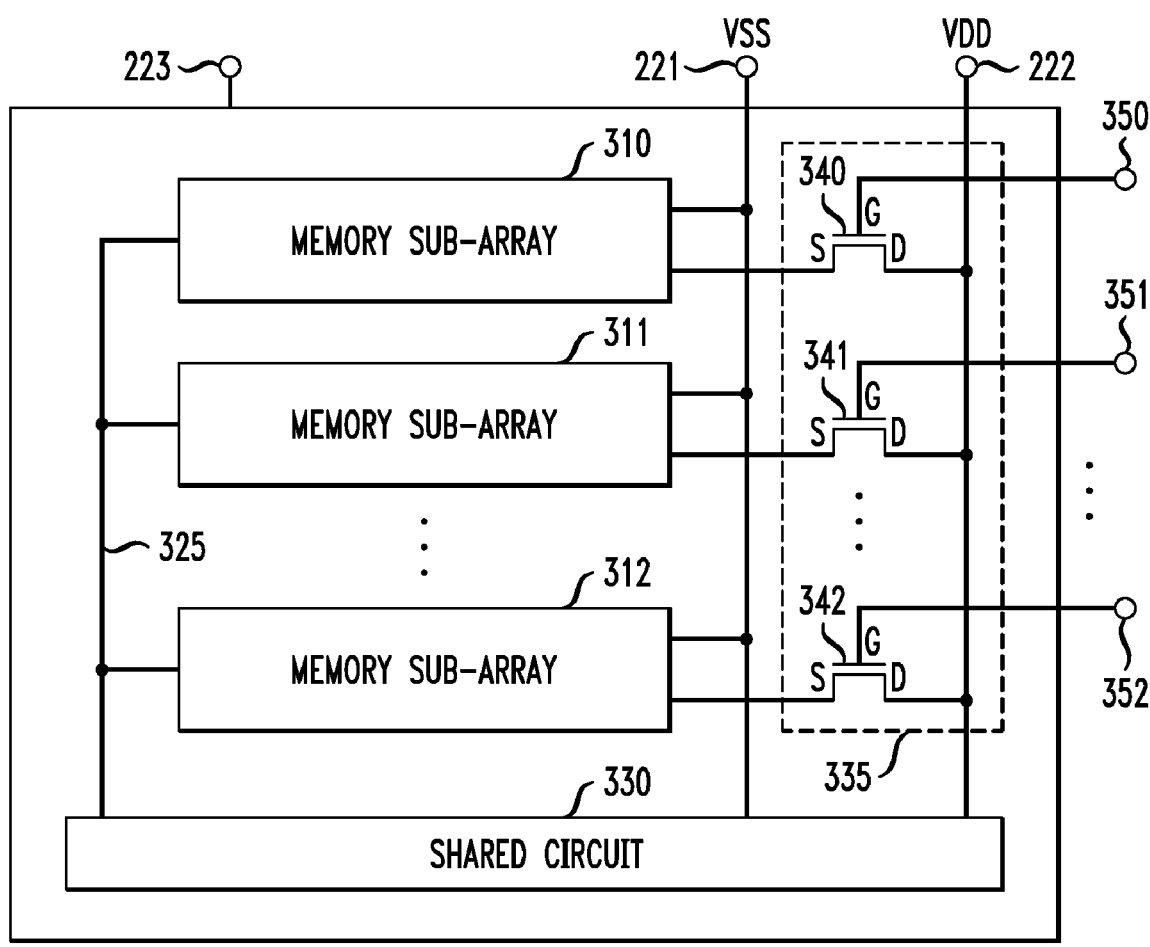
FIG. 3 is a schematic diagram depicting an exemplary memory circuit comprising multiple sub-arrays that may be individually selectively powered and selectively unpowered, in accordance with an embodiment of the present invention.

FIG. 3 is a schematic diagram depicting an exemplary memory circuit 300 comprising multiple memory sub-arrays that may be individually selectively powered and selectively unpowered, in accordance with another embodiment of the invention. More particularly, memory circuit 300 comprises a first memory sub-array 310, a second memory sub-array 311 and a third memory sub-array 312. Although only three memory sub-arrays are shown, it is to be understood that the invention is not limited to any particular number of memory sub-arrays. Memory circuit 300 may be implemented, for example, as a single-port memory, a dual-port memory, a multi-port memory, a content-addressable memory (CAM), etc.

Memory circuit 300, like memory circuit 200 shown in FIG. 2, further comprises a first power connection 221, which may be a VSS or ground connection, a second power connection 222, which may be a VDD connection, and, optionally, one or more other connections(s) 223 provided to the memory circuit. One or more of memory sub-arrays 310, 311 and 312 may be formed in a manner consistent with memory sub-array 100 depicted in FIG. 1, although alternative memory sub-array architectures are contemplated by the invention.

The first and second power connections 221 and 222 are preferably coupled to first sub-array 210, second sub-array 211 and third sub-array 212. First power connection 221 may be used, for example, for providing a connection to VSS or ground, or an alternative voltage return of the memory circuit 200. Likewise, second power connection 222 may be used, for example, for providing a connection to VDD, or an alternative voltage supply of the memory circuit 200. Connection(s) 223 may be utilized for supplying one or more other signals to the memory circuit, including, for example, a memory enable signal, address inputs, data inputs, data outputs and various memory control signals, as will be appreciated by those skilled in the art.

Memory circuit 300 further comprises at least one shared circuit 330 coupled to each of the memory sub-arrays 310, 311 and 312. At least one internal connection 325 may be employed for coupling the shared circuit 330 to the memory sub-arrays 310, 311 and 312. Shared circuit 330 preferably comprises circuitry external to the memory sub-arrays and adapted to control one or more functions of the sub-arrays. For example, shared circuit 330 may include, but is not limited to, one or more of the following: a voltage regulator, a control circuit, a delay circuit, a timing circuit, a digital circuit, an analog circuit, a redundancy circuit, a BIST circuit, a BISR circuit, one or more input buffers, and one or more output buffers. In an embodiment with BIST, shared circuit 330 is preferably adapted to test memory circuit 300 with one or more of the plurality of memory sub-arrays powered and one or more of the memory sub-arrays unpowered. The BIST circuitry may also be adapted to test memory circuit 300 with all of the memory sub-arrays 310, 311, 312 powered. Although not explicitly shown, shared circuit 330 is preferably coupled to connection(s) 223 for providing external access to and/or from the shared circuit.

The memory sub-arrays are separately coupled to at least one of the first and second power connections 221 and 222, respectively, through a switching circuit 335. In the instant configuration, each of the memory sub-arrays 310, 311 and 312 in memory circuit 300 is connected directly to the first power connection 221 and is separately connected to the second power connection 222 through the switching circuit 335. Alternatively, or in addition, a second switching circuit (not explicitly shown) may be included in memory circuit 300 to individually connect each of the memory sub-arrays 310, 311 and 312 to the first power connection 221. The switching circuit 335 includes a plurality of control inputs, 350, 351 and 352, each control input being adapted to receive a control signal for selectively connecting a corresponding memory sub-array to the first and/or second power connection.

More particularly, first memory sub-array 310 is coupled to the second power connection 222 via a first NMOS transistor device 340, second memory sub-array 311 is coupled to the second power connection 222 via a second NMOS transistor device 341, and third memory sub-array 312 is coupled to the second power connection 222 via a third NMOS transistor device 342. Specifically, a source (S) of first NMOS device 340 is connected to first memory sub-array 310, a drain (D) of device 340 is adapted for connection to second power connection 222, a source of second NMOS device 341 is connected to second memory sub-array 311, a drain of device 341 is adapted for connection to the second power connection, a source of third NMOS device 342 is connected to third memory sub-array 312, and a drain of device 342 is adapted for connection to the second power connection. A gate (G) of first NMOS device 340 is adapted to receive a first control signal through first control input 350, a gate of second NMOS device 341 is adapted to receive a second control signal through second control input 351, and a gate of third NMOS device 342 is adapted to receive a third control signal through third control input 352.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

When a logic high ("1") voltage level (e.g., VDD) is applied to the gate of a given one of the NMOS devices 340, 341 or 342 (e.g., via control inputs 350, 351 or 352, respectively), the device will turn on, providing a low-resistance (e.g., less than about one ohm) electrical path between its source and drain to thereby effectively connect a corresponding memory sub-array to the second power connection 222. Alternatively, when a logic low ("0") voltage level is applied to the gate of the given one of the NMOS devices, the device will turn off, effectively open-circuiting the connection between the corresponding memory sub-array and the second power connection 222. It is to be appreciated that switching circuit 335 is merely illustrative, and that alternative switching arrangements are similarly contemplated by the invention. For example, one or more of the NMOS devices 340, 341 or 342 may be replaced by a corresponding PMOS transistor device. In this instance, the voltage levels applied to the control inputs 350, 351 or 352 for activating or deactivating a given PMOS device will be reversed (e.g., a logic high voltage level is used to turn off a given PMOS device, and a logic low voltage level is used to turn on the PMOS device). Alternatively, a PMOS device may be connected in parallel with one of NMOS devices 340, 341 or 342, so as to essentially form a complementary pass gate, with a gate of the PMOS device receiving a logical complement of the control signal applied to the gate of the NMOS device. While the invention is not limited to any specific voltage level applied to the control inputs 350, 351 and 352, the magnitude of a voltage difference applied to the gate of a given device, relative to the source of the device, should be greater than a transistor threshold voltage ($V_t$) so as to sufficiently turn on the device.

The second voltage supply (e.g., VDD), conveyed via second power connection 222, couples through the first transistor 340, the second transistor 341 and the third transistor 342 to the first memory sub-array 310, the second memory sub-array 311 and the third memory sub-array 312, respectively. First memory sub-array 310 receives power from the second power connection when first transistor 340 is conductive, that is, in an on-state. The first transistor is selectively activated as a function of the first control signal supplied to the first control input 350. Similarly, first memory sub-array 310 is disconnected from the second power connection 222 when first transistor 340 is non-conductive, that is, in an off-state. The first transistor is in the off-state when disabled by the first control signal supplied to the first control input 350. The remaining transistors 341 and 342 in switching circuit 335 operate in a manner consistent with the operation of transistor 340 described above.

More particularly, second memory sub-array 311 preferably receives power from the second power connection 222 when the second transistor 341 is conductive, that is, in the on-state. The second transistor is selectively activated as a function of the second control signal supplied to the second control input 351. For example, assuming the second transistor 341 is an NMOS device as shown, transistor 341 will be in the on-state when the second control signal is at a logic high level, for example, VDD. Likewise, the third memory sub-array 312 receives power from the second power connection 222 when the third transistor 342 is conductive, that is, in the on-state. The third transistor is selectively activated as a function of the third control signal supplied to the third control input 352. For example, assuming the third transistor 342 is an NMOS device as shown, transistor 342 will be in the on-state when the third control signal is at a logic high level. In this manner, power can be individually applied to one or more of the memory sub-arrays 310, 311 and 312, and power can be selectively disconnected from one or more of the memory sub-arrays, as a function of the first, second and third control signals, respectively.

Figure 4:
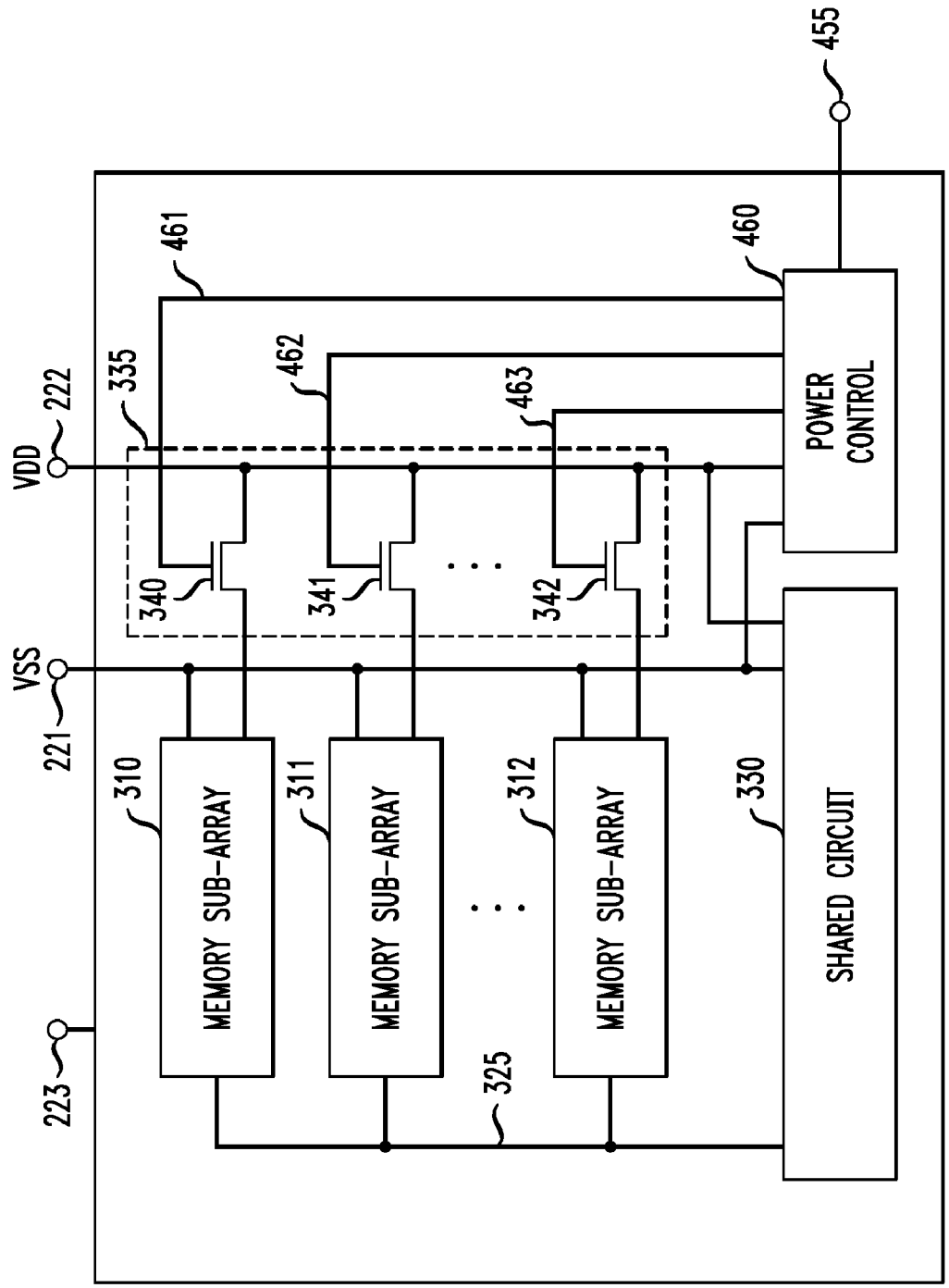
FIG. 4 is a schematic diagram depicting an exemplary memory circuit comprising multiple memory sub-arrays that may be individually selectively powered and selectively unpowered using a power control circuit, in accordance with another embodiment of the present invention.

With reference now to FIG. 4, a schematic diagram depicting an exemplary memory circuit 400 is shown comprising multiple memory sub-arrays that may be selectively powered and selectively unpowered using a power control circuit, in accordance with another embodiment of the present invention. Memory circuit 400 is essentially the same as memory circuit 300 shown in FIG. 3, with the exception of the inclusion of a power control circuit 460 coupled to switching circuit 335. Memory circuit 400 may be implemented, for example, as a single-port memory, a dual-port memory, a multi-port memory, a CAM, etc.

Specifically, memory circuit 400 preferably includes a plurality of memory sub-arrays, namely, a first memory sub-array 310, a second memory sub-array 311 and a third memory sub-array 312. Memory circuit 400, like memory circuit 300 shown in FIG. 3, further comprises a first power connection 221, which may be a VSS or ground connection, a second power connection 222, which may be a VDD connection, and, optionally, one or more other connections 223 provided to the memory circuit for providing access to and/or from one or more functional blocks in the memory circuit. One or more of memory sub-arrays 310, 311 and 312 may be formed in a manner consistent with memory sub-array 100 depicted in FIG. 1, although alternative memory sub-array architectures are contemplated by the invention.

Memory circuit 400 further comprises at least one shared circuit 330 coupled to each of the memory sub-arrays 310, 311 and 312. At least one internal connection 325 may be employed for coupling the shared circuit 330 to the memory sub-arrays 310, 311 and 312. Shared circuit 330 preferably comprises circuitry external to the memory sub-arrays and adapted to control one or more functions of the sub-arrays. Shared circuit 330 may include, but is not limited to, one or more of the following: a voltage regulator, a control circuit, a delay circuit, a timing circuit, a digital circuit, an analog circuit, a redundancy circuit, a BIST circuit, a BISR circuit, one or more input buffers, and one or more output buffers. In an embodiment with BIST, shared circuit 330 is preferably adapted to test memory circuit 400 with one or more of the plurality of memory sub-arrays powered and one or more of the memory sub-arrays unpowered. The BIST circuitry may also be adapted to test memory circuit 400 with all of the memory sub-arrays 310, 311, 312 powered. Although not explicitly shown, shared circuit 330 is preferably coupled to connection(s) 223 for providing external access to and/or from the shared circuit.

In a manner consistent with the memory circuit arrangement shown in FIG. 3, memory sub-arrays 310, 311, 312 in memory circuit 400 are separately coupled to at least one of the first and second power connections 221 and 222, respectively, through switching circuit 335. Specifically, as previously described in conjunction with FIG. 3, first memory sub-array 310 is coupled to the second power connection 222 via a first NMOS transistor device 340, second memory sub-array 311 is coupled to the second power connection 222 via a second NMOS transistor device 341, and third memory sub-array 312 is coupled to the second power connection 222 via a third NMOS transistor device 342. NMOS devices 340, 341 and 342 are preferably power-switching transistors. More particularly, a source of first NMOS device 340 is connected to first memory sub-array 310, a drain of device 340 is adapted for connection to second power connection 222, a source of second NMOS device 341 is connected to second memory sub-array 311, a drain of device 341 is adapted for connection to the second power connection, a source of third NMOS device 342 is connected to third memory sub-array 312, and a drain of device 342 is adapted for connection to the second power connection. Although the first power connection 221 is shown as being connected directly to memory sub-arrays 310, 311 and 312, the invention contemplates that a second switching circuit (not explicitly shown) may be included in memory circuit 400 for individually connecting the memory sub-arrays to the first power connection.

A gate of each of the first, second and third NMOS devices 340, 341 and 342, respectively, is preferably connected to power control circuit 460 included in memory circuit 400. Specifically, a first power control output 461, a second power control output 462 and a third power control output 463 are connected to gates of NMOS devices 340, 341 and 342, respectively. Power control circuit 460 is operative to generate control signals (conveyed via power control outputs 461, 462, 463) for individually activating the NMOS devices 340, 341 and 342 in switching circuit 335 as a function of one or more control signals applied to at least one power control input 455.

More particularly, the first memory sub-array 310 receives power from the second voltage supply only when the first transistor 340 is conductive, that is, in the on-state. The first transistor is in the on-state when activated by first power control output 461. For example, if first transistor 340 is an NMOS device, the first transistor is in the on-state when the first power control output 461 is at the voltage level of the second voltage supply (logic 1), for example, VDD. Likewise, the second sub-array 311 receives power from the second voltage supply only when the second transistor 341 is conductive, that is, in the on-state. The second transistor is on the on-state when activated by second power control output 462. For example, if second transistor 340 is an NMOS device, the second transistor is in the on-state when the second power control output 462 is at VDD. The third sub-array 312 receives power from the second voltage supply only when the third transistor 342 is conductive, that is, in the on-state. The third transistor is on the on-state when activated by third power control output 463. For example, if third transistor 342 is an NMOS device, the third transistor is in the on-state when the third power control output 463 is at VDD. Thus, using power control circuit 460, voltage can be selectively applied to one or more memory sub-arrays, and voltage can be selectively withheld from one or more memory sub-arrays.

The first, second and third power control outputs 461, 462 and 463, respectively, will typically reside in one of two states, or be in transition between the two states, namely, logic-1 and logic-0. A logic-1 state preferably represents a signal level substantially equal to the voltage level of the second voltage supply, for example, VDD; a logic-0 state preferably represents a signal level substantially equal to the voltage level of the first voltage supply, for example, ground. It is to be understood, however, that the invention is not limited to any particular voltage levels assigned to the respective logical states. For embodiments wherein first transistor 340, second transistor 342 and third transistor 343 are implemented using NMOS devices, a logic-1 state on one of the power control output activates a corresponding one of the transistors.

FIG. 5 is a table illustrating a correspondence between states (e.g., logic-0 and logic-1) of the first, second and third power control outputs 461, 462 and 463, respectively, and the activation (e.g., on-state and off-state) of power-switching transistors 340, 341, 342 in the switching circuit 335 for the illustrative memory circuit 400 shown in FIG. 4, in accordance with an embodiment of the invention. The table in FIG. 5 also illustrates which memory sub-arrays (e.g., memory sub-arrays 310, 311 and 312) are powered and which memory sub-arrays are unpowered as a function of the logical states of the respective power control outputs. As apparent from the figure, with three power control outputs, each power control output residing in one of two possible states, there will be a total of eight unique combinations for powering the memory sub-arrays 310, 311, 312. It is to be appreciated, however, that the invention is not limited to any particular number of memory sub-arrays and/or power control outputs. For example, when four memory sub-arrays are employed (not shown), four power control outputs may be utilized, thereby providing 16 unique combinations for powering the sub-arrays.

Power control circuit 460 comprises circuitry (e.g., logic circuitry) that generates the signals conveyed on the respective power control outputs 461, 462, 463 as a function of, for example, a composite power control signal supplied to power control input 455 of the power control circuit 460, in which case the power control input may comprise a plurality of inputs (e.g., a bus). For example, the three power control outputs may have the same states (logic-0 and/or logic-1) as three composite power control input signals, comprising logic-0 and/or logic-1 states, supplied to power control input 455. Specifically, first power control output 461 may have the same state as a first composite power control input signal, second power control output 462 may have the same state as a second composite power control input signal, and third power control output 463 may have the same state as a third composite power control input signal.

In other embodiments, the power control input 455 may be adapted to receive a single power control input signal. In this instance, the power control input signal preferably comprises a serial signal including information on how to set the states on the power control outputs 461, 462 and 463. Alternative correspondences, other than those shown in FIG. 5, between the composite input signals presented to power control input 455 and the power control outputs may be similarly employed, according to embodiments of the invention. The power control circuit 460 may comprise transistors that are of smaller size and lower power handling capacity compared to transistors 340, 341 and 342 in switching circuit 335.

As previously stated, unpowered memory sub-arrays comprising only volatile memory cells will not retain data, while unpowered memory sub-arrays comprising non-volatile memory cells will retain data. In either case, unpowered sub-arrays reduce power of memory circuit 300 (FIG. 3), memory circuit 400 (FIG. 4), and integrated circuits comprising the memory circuit 300 and/or memory circuit 400.

In memory circuit 300 shown in FIG. 3 and in memory circuit 400 shown in FIG. 4, first memory sub-array 310 may comprise a different type of memory cell than second or third memory sub-arrays 311 and 312, respectively. For example, in one illustrative embodiment first memory sub-array 310 may comprise volatile memory cells (e.g., SRAM and/or DRAM memory cells) and second memory sub-array 311 may comprise non-volatile memory cells (e.g., ROM, flash, phase change, OTP and/or FTP memory cells). In a second illustrative embodiment, first and second memory sub-arrays 310 and 311, respectively, may both comprise volatile memory cells of the same or of different types (e.g., first memory sub-array 310 may comprise SRAM cells and second memory sub-array 311 may comprise DRAM cells). In a third illustrative embodiment, first and second memory sub-arrays 310 and 311, respectively, may both comprise different types or the same type of non-volatile memory cells (e.g., first memory sub-array 310 may comprise ROM cells and second memory sub-array 311 may comprise OTP, FTP or flash memory cells). Various other combinations of arrays comprising the same or different types of memory cells are similarly possible, as will become apparent to those skilled in the art given the teachings herein. Furthermore, there may be more than two different types of arrays, each array comprising a different type of memory cells.

Figure 6:
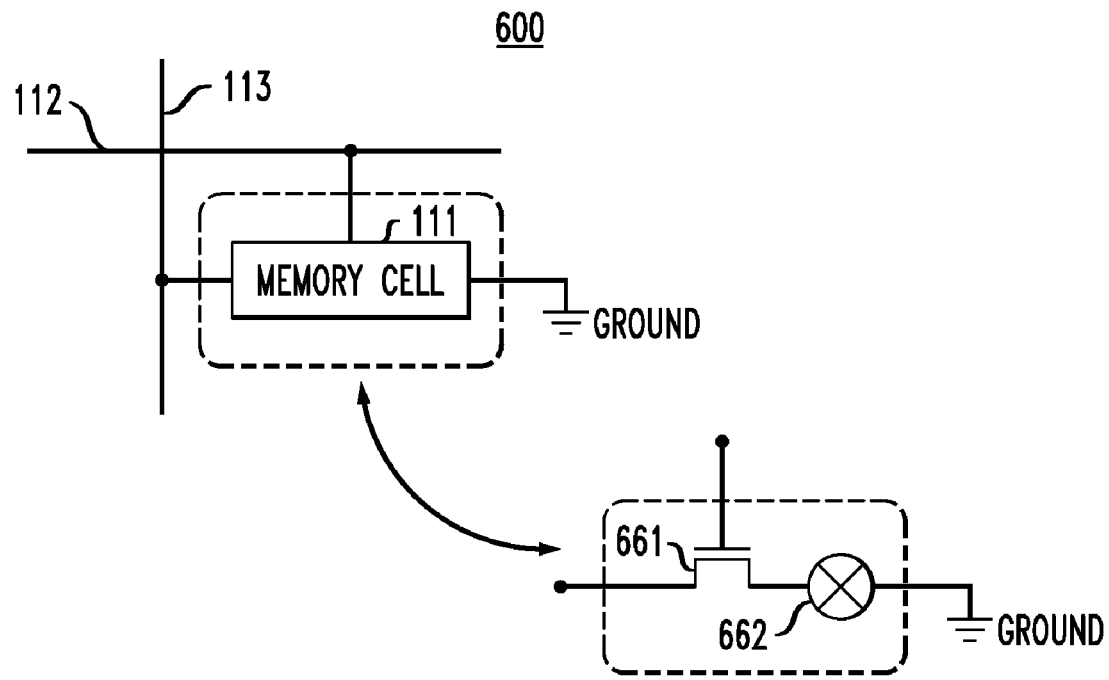
FIG. 6 is a schematic diagram depicting at least a portion of an exemplary memory sub-array suitable for use, for example, in the illustrative memory circuits depicted in FIGS. 2, 3 and 4.

FIG. 6 is a schematic diagram depicting at least a portion of an exemplary memory sub-array 600 suitable for use, for example, in the illustrative memory circuits 200, 300 and 400 depicted in FIGS. 2, 3 and 4, respectively. Memory sub-array 600 preferably comprises a plurality of memory cells 111, only one of which is shown, each memory cell being coupled to a corresponding row line 112 and column line 113, as previously described in conjunction with FIGS. 2, 3 and 4. Memory cell 111 comprises an NMOS access transistor 661, or an alternative switching element, and a programmable connection 662 to ground, or an alternative voltage source (e.g., VSS).

Specifically, a first source/drain of access transistor 661 is adapted for connection to column line 113, a second source/drain of access transistor 661 is adapted for connection to a first terminal of programmable connection 662, and a gate of access transistor 661 is adapted for connection to row line 112. A second terminal of programmable connection 662 is coupled to ground. Alternatively, the placement of access transistor 661 and programmable connection 662 could be reversed so that access transistor 661 is coupled directly to ground and the programmable connection 662 is coupled to the column line 113. In other ROM cell embodiments, access transistor 661 may be implemented, for example, using a PMOS transistor. As previously mentioned, other types of memory cells 111 are contemplated.

Figure 7:
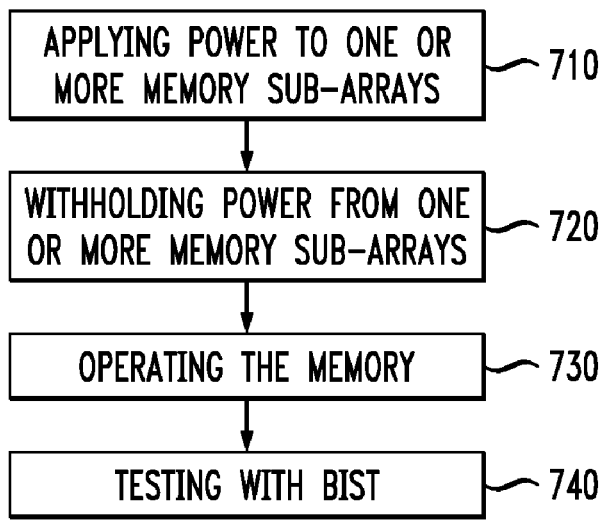
FIG. 7 is a logical flow diagram depicting an exemplary method of operating a memory, in accordance with an embodiment of the present invention.

FIG. 7 is a logical flow diagram depicting an exemplary method 700 of powering a memory circuit (e.g., memory circuits 300 and 400 shown in FIGS. 3 and 4, respectively), in accordance with an embodiment of the present invention. In step 710, power is selectively applied to one or more of the memory sub-arrays 310, 311 and 312 (see, e.g., FIG. 3). In step 720, power is selectively withheld from a different one or more of the memory sub-arrays 310, 311 and 312. The power is preferably applied to one or more of the memory sub-arrays 310, 311 and 312 at the same time that power is withheld from one or more of the memory sub-arrays 310, 311 and 312. In steps 710 and 720, power is preferably applied to or withheld from the memory sub-arrays 310, 311 and 312 according to the state of power control inputs 350, 351 and 352, or, in an alternate embodiment, according to the composite power control inputs 355, as previously described.

Once power is selectively applied to and withheld from the individual memory sub-arrays in steps 710 and 720, respectively, method 700 proceeds to step 730. In step 730, the memory circuit is preferably operated in a usual manner, except for the selective application of power to the memory sub-arrays 310, 311 and 312, where power is applied to only some, but not all, of the memory sub-arrays. Operation of the memory circuit in the usual manner may include, but is not limited to, reading, writing, and programming one or more memory cells in the memory circuit, and may further include maintaining data and/or refreshing data within one or more of the memory cells (e.g., in the case of volatile memory cells) in the memory circuit. During operation, the memory circuit may be operative in an active state or a standby state.

In step 740, which is optional, the memory circuit is tested using, for example, BIST. The memory circuit may be tested with all of the memory sub-arrays powered and/or with one or more memory sub-arrays powered and one or more of the memory sub-arrays unpowered. In addition to BIST testing, memory repair may be done using, for example, built-in self-repair (BISR). Circuitry operative for performing BIST and/or BISR may be incorporated within the memory circuit, for example, within the shared circuit 330 (see, e.g., FIGS. 3 and 4).

At least a portion of the techniques of the present invention may be implemented in one or more integrated circuits. In forming integrated circuits, die are typically fabricated in a repeated pattern on a surface of a semiconductor wafer. Individual die are cut or diced from the wafer, then packaged as integrated circuits. In packaging the dies, individual die are attached to a receiving substrate according to methods of the invention. One skilled in the art would know how to dice wafers to produce integrated circuits. Integrated circuits so manufactured are considered part of this invention.

An integrated circuit formed in accordance with interconnection techniques of the present invention can be employed in essentially any application and/or electronic system utilizing memory (e.g., embedded memory). Suitable systems for implementing the invention may include, but are not limited to, personal computers, communication networks, portable communications devices (e.g., cell phones), etc. Systems incorporating such integrated circuits are considered part of this invention. Given the teachings of the invention provided herein, one of ordinary skill in the art will be able to contemplate other implementations and applications of the techniques of the invention.

Figure 8:
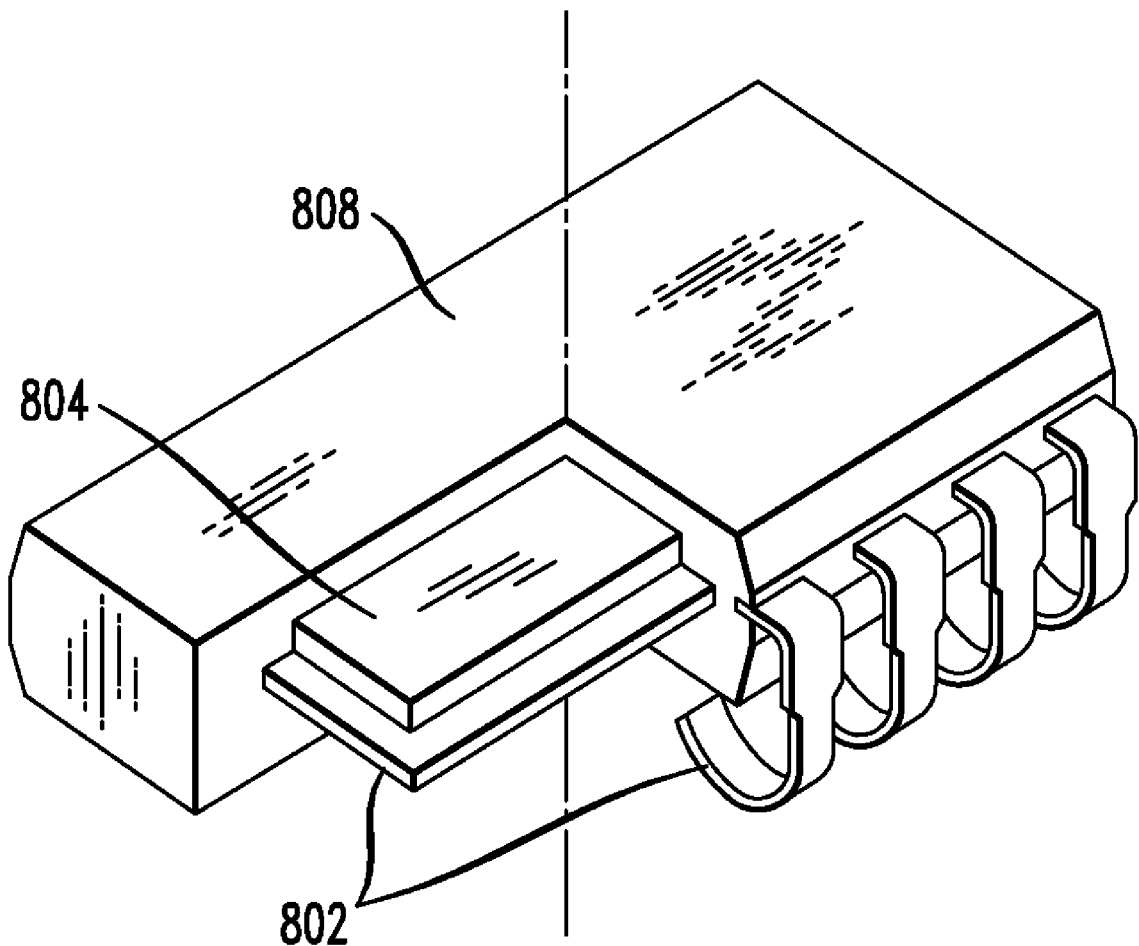
FIG. 8 is a cross-sectional view depicting an exemplary packaged integrated circuit comprising at least one memory circuit, formed in accordance with an embodiment of the present invention.

FIG. 8 is a cross-sectional view depicting an exemplary packaged integrated circuit 800 comprising at least one memory circuit, formed in accordance with an embodiment of the present invention. The packaged integrated circuit 800 preferably comprises a leadframe 802, or an alternative receiving substrate, an integrated circuit die 804, and a molded encapsulation 808. The die 804 includes at least one memory circuit, such as memory circuit 300 or 400 shown in FIG. 3 or 4, respectively, according to embodiments of the present invention. Encapsulation 808 preferably surrounds the die/leadframe combination, as in a conventional manner. Although FIG. 8 shows only one type of integrated circuit package, the invention is not so limited. Rather, the invention may comprise an integrated circuit die enclosed in essentially any package type (e.g., ceramic).

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory circuit, comprising:
    a plurality of memory sub-arrays, each of the memory sub-arrays including at least one row circuit, at least one column circuit, and a plurality of memory cells operatively coupled to the row and column circuits, the row and column circuits being operative to provide selective access to one or more of the memory cells;
    a shared circuit coupled to each of the memory sub-arrays, the shared circuit comprising circuitry, external to the plurality of memory sub-arrays, which is operative to control one or more functions of the plurality of memory sub-arrays as a function of at least one control signal supplied to the memory circuit; and
    a power control circuit external to the shared circuit and to the plurality of memory sub-arrays, the power control circuit being operative to individually control application of power to the plurality of memory sub-arrays;
    wherein the memory circuit is operative, with at least one of the plurality of memory sub-arrays operative, with one or more of the plurality of memory sub-arrays powered and concurrently with one or more of the plurality of memory sub-arrays unpowered.

2. The memory circuit of claim 1, further comprising a switching circuit connected to each of the memory sub-arrays and to at least a first power connection adapted to convey a first supply voltage supplied to the memory circuit, the switching circuit being operative to selectively individually connect at least one of the respective memory sub-arrays to or selectively individually disconnect at least one of the respective memory sub-arrays from the first power connection as a function of at least one control signal supplied to the switching circuit.

3. The memory circuit of claim 2, wherein the switching circuit comprises:
a first transistor comprising a first source/drain coupled to a first one of the memory sub-arrays, a second source/drain coupled to the first power connection, and a gate adapted for receiving a first control signal, the first transistor being operative to selectively connect the first memory sub-array to the first power connection as a function of the first control signal; and
at least a second transistor comprising a first source/drain coupled to a second one of the memory sub-arrays, a second source/drain coupled to the first power connection, and a gate adapted for receiving a second control signal, the second transistor being operative to selectively connect the second memory sub-array to the first power connection as a function of the second control signal.

4. The memory circuit of claim 3, wherein the first control signal being in a first state affects the first supply voltage to be applied to the first memory sub-array, and the first control signal being in a second state affects the first supply voltage to be withheld from the first memory sub-array, and wherein the second control signal being in the first state affects the first supply voltage to be applied to the second memory sub-array, and the second control signal being in the second state affects the first supply voltage to be withheld from the second memory sub-array.

5. The memory circuit of claim 3, wherein the power control circuit is operative to generate the first and the second control signals as a function of a composite control signal received by the power control circuit, wherein the composite control signal being in a first state affects the first supply voltage to be applied to the first memory sub-array, the composite control signal being in a second state affects the first supply voltage to be withheld from the first memory sub-array, the composite control signal being in a third state affects the first supply voltage to be applied to the second memory sub-array, and the composite control signal being in a fourth state affects the first supply voltage to be withheld from the second memory sub-array.

6. The memory circuit of claim 5, wherein the power control circuit comprises a plurality of transistors configured to conduct less power than the first and second transistors in the switching circuit.

7. The memory circuit of claim 5, wherein the composite power control signal comprises a serial signal.

8. The memory circuit of claim 1, wherein at least a first one of the plurality of memory sub-arrays comprises a volatile memory and at least a second one of the plurality of memory sub-arrays comprises a non-volatile memory.

9. The memory circuit of claim 8, wherein the volatile memory comprises at least one of static random access memory cells and dynamic random access memory cells, and wherein the non-volatile memory comprises at least one of flash memory cells, phase change memory cells, one time programmable memory cells, few times programmable memory cells, and read-only memory cells.

10. The memory circuit of claim 1, wherein at least a first one of the plurality of memory sub-arrays comprises a first type of volatile memory and at least a second one of the plurality of memory sub-arrays comprises a second type of volatile memory.

11. The memory circuit of claim 1, wherein at least a first one of the plurality of memory sub-arrays comprises a first type of non-volatile memory and at least a second one of the plurality of memory sub-arrays comprises a second type of non-volatile memory.

12. The memory circuit of claim 1, wherein the row circuit in at least a given one of the memory sub-arrays comprises a row address decoder and at least one row driver coupled to the row address decoder and to at least one corresponding row line in the given memory sub-array, and wherein the column circuit in the given memory sub-array comprises a column address decoder and at least one sense amplifier coupled to the column address decoder and to at least one corresponding column line in the given memory sub-array.

13. The memory circuit of claim 1, wherein the shared circuit comprises at least one of a voltage regulator, a control circuit, a delay circuit, a timing circuit, a digital circuit, an analog circuit, a redundancy circuit, a built-in-self-test circuit, a built-in-self-repair circuit, an input buffer and an output buffer.

14. The memory circuit of claim 1, wherein the shared circuit comprises a built-in-self-test circuit operative to test the memory circuit with at least one of the plurality of memory sub-arrays powered and at least one of the memory sub-arrays unpowered.

15. The memory circuit of claim 1, wherein at least one of the plurality of memory sub-arrays comprises at least one of a single-port memory, a dual-port memory, a multi-port memory, and a content-addressable memory.

16. An integrated circuit including at least one memory circuit, the at least one memory circuit comprising:
a plurality of memory sub-arrays, each of the memory sub-arrays including at least one row circuit, at least one column circuit, and a plurality of memory cells operatively coupled to the row and column circuits, the row and column circuit being operative to provide selective access to one or more of the memory cells;
a shared circuit coupled to each of the memory sub-arrays, the shared circuit comprising circuitry, external to the plurality of memory sub-arrays, which is operative to control one or more functions of the plurality of memory sub-arrays as a function of at least one control signal supplied to the memory circuit; and
a power control circuit external to the shared circuit and to the plurality of memory sub-arrays, the power control circuit being operative to individually control application of power to the plurality of memory sub-arrays;
wherein the memory circuit is operative, with at least one of the plurality of memory sub-arrays operative, with one or more of the plurality of memory sub-arrays powered and concurrently with one or more of the plurality of memory sub-arrays unpowered.

17. The integrated circuit of claim 16, wherein the at least one memory circuit further comprises a switching circuit connected to each of the memory sub-arrays and to at least a first power connection adapted to convey a first supply voltage supplied to the memory circuit, the switching circuit being operative to selectively individually connect at least one of the respective memory sub-arrays to or selectively individually disconnect at least one of the respective memory sub-arrays from the first power connection as a function of at least one control signal supplied to the switching circuit.

18. The integrated circuit of claim 17, wherein the switching circuit comprises:
a first transistor comprising a first source/drain coupled to a first one of the memory sub-arrays, a second source/drain coupled to the first power connection, and a gate adapted for receiving a first control signal, the first transistor being operative to selectively connect the first memory sub-array to the first power connection as a function of the first control signal; and at least a second transistor comprising a first source/drain coupled to a second one of the memory sub-arrays, a second source/drain coupled to the first power connection, and a gate adapted for receiving a second control signal, the second transistor being operative to selectively connect the second memory sub-array to the first power connection as a function of the second control signal.

19. The integrated circuit of claim 18, wherein the power control circuit is operative to generate the first and the second control signals as a function of a composite control signal received by the power control circuit, wherein the composite control signal being in a first state affects the first supply voltage to be applied to the first memory sub-array, the composite control signal being in a second state affects the first supply voltage to be withheld from the first memory sub-array, the composite control signal being in a third state affects the first supply voltage to be applied to the second memory sub-array, and the composite control signal being in a fourth state affects the first supply voltage to be withheld from the second memory sub-array.

20. An electronic system, comprising:

at least one integrated circuit including at least one embedded memory circuit, the at least one embedded memory circuit comprising:

a plurality of memory sub-arrays, each of the memory sub-arrays including at least one row circuit, at least one column circuit, and a plurality of memory cells operatively coupled to the row and column circuits, the row and column circuits being operative to provide selective access to one or more of the memory cells;

a shared circuit coupled to each of the memory sub-arrays, the shared circuit comprising circuitry, external to the plurality of memory sub-arrays, which is operative to control one or more functions of the plurality of memory sub-arrays as a function of at least one control signal supplied to the embedded memory circuit; and a power control circuit external to the shared circuit and to the plurality of memory sub-arrays, the power control circuit being operative to individually control application of power to the plurality of memory sub-arrays;

wherein the memory circuit is operative, with at least one of the plurality of memory sub-arrays operative, with one or more of the plurality of memory sub-arrays powered and concurrently with one or more of the plurality of memory sub-arrays unpowered.

* * * * *